(12) United States Patent
Berger et al.

(10) Patent No.: US 10,211,641 B2
(45) Date of Patent: Feb. 19, 2019

(54) METHOD FOR OPERATING A PHOTOVOLTAIC SYSTEM COMPRISING AN ENERGY STORE AND A BIDIRECTIONAL CONVERTER FOR CONNECTION OF AN ENERGY STORE

(71) Applicant: SMA Solar Technology AG, Niestetal (DE)

(72) Inventors: Niels Berger, Niestetal (DE); Sebastian Heinze, Hamburg (DE)

(73) Assignee: SMA Solar Technology AG, Niestetal (DE)

( * ) Notice: Subject to any disclaimer, the term of this patent is extended or adjusted under 35 U.S.C. 154(b) by 239 days.

(21) Appl. No.: 15/146,017

(22) Filed: May 4, 2016

(65) Prior Publication Data

US 2016/0248259 A1 Aug. 25, 2016

Related U.S. Application Data

(63) Continuation of application No. PCT/EP2014/073395, filed on Oct. 30, 2014.

(30) Foreign Application Priority Data

Nov. 4, 2013 (DE) .......................... 10 2013 112 077

(51) Int. Cl.
*H02J 3/38* (2006.01)
*H01L 31/02* (2006.01)
(Continued)

(52) U.S. Cl.
CPC ........ *H02J 3/385* (2013.01); *H01L 31/02021* (2013.01); *H02J 3/32* (2013.01);
(Continued)

(58) Field of Classification Search
CPC ....................................................... H02J 3/385
See application file for complete search history.

(56) References Cited

U.S. PATENT DOCUMENTS 8,432,143 B2 * 4/2013 Schaacke .......... H01L 31/02021
323/224
9,559,614 B2 * 1/2017 Eberhardt ............... H02J 3/383
(Continued)

FOREIGN PATENT DOCUMENTS

DE 2023522 1/1972

OTHER PUBLICATIONS

International Search Report dated Jan. 16, 2015 PCT/EP2014/073395.

*Primary Examiner* — Hai L Nguyen
(74) *Attorney, Agent, or Firm* — Eschweiler & Potashnik, LLC

(57) ABSTRACT

A photovoltaic system having an inverter and a photovoltaic generator connected to an inverter input is configured to track an operating voltage of maximum power from the photovoltaic generator. The system also includes an energy store coupled in parallel with the photovoltaic generator, to the input of the inverter. A temporal profile of the power output by the photovoltaic generator is recorded by the converter and compensates for fluctuations in power from the photovoltaic generator in comparison with a target power by adapting the power ($P_{DC}$) output by it at the input or branched off from there in such a manner that the sum of the power ($P_{DC}$) from the converter and the power ($P_{PV}$) from the photovoltaic generator is equal to the target power ($P_{Soll}$). The converter is operated in a tracking mode that it makes it possible to track the operating voltage of maximum power by means of the inverter. There is a repeated change between the compensation mode and the tracking mode (Continued)

during ongoing operation of the photovoltaic system in which power from the photovoltaic generator is available.

15 Claims, 2 Drawing Sheets

(51) Int. Cl.
*H02J 3/32* (2006.01)
*H02J 7/35* (2006.01)

(52) U.S. Cl.
CPC ............... *H02J 7/35* (2013.01); *Y02E 10/566* (2013.01); *Y02E 10/58* (2013.01); *Y02E 70/30* (2013.01)

(56) References Cited

U.S. PATENT DOCUMENTS

2009/0302681 A1 12/2009 Yamada et al.
2012/0261990 A1 10/2012 Collins et al.
2015/0295412 A1 10/2015 Schiffmann et al.

\* cited by examiner

METHOD FOR OPERATING A PHOTOVOLTAIC SYSTEM COMPRISING AN ENERGY STORE AND A BIDIRECTIONAL CONVERTER FOR CONNECTION OF AN ENERGY STORE

CROSS REFERENCE TO RELATED APPLICATIONS

This application claims priority to International Patent Application number PCT/EP2014/073395, filed on Oct. 30, 2014, which claims priority to German Patent Application number 10 2013 112 077.6, filed on Nov. 4, 2013, and is hereby incorporated by reference in its entirety.

FIELD

The disclosure relates to a method for operating a photovoltaic system comprising an energy store, and also relates to a bidirectional converter for connecting an energy store, which implements such a method.

BACKGROUND

Since photovoltaic generators do not provide any electrical power at night and provide a variable electrical power which even fluctuates in the short term depending on the cloud cover during the day, the integration of energy stores for electrical energy is of particular interest. With such energy stores, photovoltaic systems could be enabled to provide a constant electrical power even at night and during the day.

SUMMARY

The disclosure is based on the object of showing a method for operating a photovoltaic system comprising an energy store and a converter for connecting an energy store which provide an energy store which can be easily retrofitted in a photovoltaic system with an enhanced functionality.

A method according to the disclosure is provided for operating a photovoltaic system comprising an inverter, a photovoltaic generator connected to an input of the inverter, an energy store for electrical energy and a bidirectional converter, via which the energy store is connected, in parallel with the photovoltaic generator, to the input of the inverter. More precisely, the method is provided for such a photovoltaic system in which the inverter predefines an operating voltage of the photovoltaic generator at the input and is configured to track an operating voltage of maximum power from the photovoltaic generator. In other words, the inverter has an MPP tracker. In order to avoid a collision between this MPP tracker and the bidirectional converter, a temporal profile of the power output by the photovoltaic generator is recorded by the converter. On the basis of this, the converter is operated in an operating mode, which is referred to as a compensation mode, that compensates for fluctuations in the power from the photovoltaic generator in comparison with a target power flowing into the inverter via the input. This power compensation results in the inverter not receiving any greater power via the input if the operating voltage at the input changes and accordingly not changing the operating voltage in order to find an operating voltage of maximum power which deviates from the instantaneous operating voltage. That is to say, although the MPP tracker of the inverter is likewise active in this operating mode of the converter, it is ineffective. Conversely, this operating mode allows compensation for fluctuations in the power from the photovoltaic generator such that, despite these power fluctuations, a constant electrical power can be provided using the photovoltaic system. In addition, the MPP tracker of the inverter is also not guided to an incorrect operating voltage of maximum power as a result of uncoordinated power fluctuations of the converter.

In order to nevertheless be able to use the tracking of the operating voltage of maximum power from the photovoltaic generator by the inverter, the converter is operated in another operating mode, which is referred to as a tracking mode, in the method according to the disclosure to enable tracking of the operating voltage of maximum power. This can be carried out, for example, as known from DE 10 2012 002 185 A1, by virtue of the converter outputting a constant power to the inverter via the input in this other operating mode or receiving a constant power from the photovoltaic generator.

In the method according to the disclosure, there is a repeated change between the two operating modes of the converter during ongoing operation of the photovoltaic system in which power from the photovoltaic generator is available, that is to say during the day. The phases in which the converter is operated in the tracking mode in order to track the operating voltage of maximum power by means of the inverter may be considered in this case to be interruptions in the operating mode of the converter in which it compensates for power fluctuations of the photovoltaic generator in comparison with the target power flowing into the inverter via the input, as desired. These interruptions can then be restricted to a necessary minimum because the desired compensation for fluctuations in the power from the photovoltaic generator cannot be carried out during these interruptions.

In the method according to the disclosure, the change from the compensation mode to the tracking mode is therefore made as rarely as possible, but typically at least once per hour. It is then possible to respectively quickly change from the tracking mode back to the compensation mode, typically at the latest after two minutes.

In principle, it is also possible to change between the compensation mode and the operating mode after fixed predefined periods. However, this procedure does not take into account the instantaneous development of the operating states. It is therefore advantageous in one embodiment if the operating voltage of maximum power is inferred from the temporal profile of the power output by the photovoltaic generator in the compensation mode, and if there is a change from the compensation mode to the tracking mode of the converter only when the instantaneous operating voltage at the input deviates from the operating voltage of maximum power predicted in this manner beyond a predefined extent. In this case, the predefined extent may be determined such that a maximum loss of power from the photovoltaic generator owing to the failure to comply with the operating voltage of maximum power is restricted to a particular percentage or absolute value.

The converter can be operated in the tracking mode, in particular, in such a manner that it assists with the tracking of the operating voltage of maximum power by the inverter. For this purpose, it can cause additional power changes on the basis of changes in the operating voltage at the input which are in the same direction as the power changes of the photovoltaic generator on the basis of the changes in the operating voltage at the input. This makes it possible to considerably accelerate the tracking or retrieval of the operating voltage of maximum power by the inverter. This in turn makes it possible to minimize the phase or period in which the converter is operated in the tracking mode and therefore not in the compensation mode.

Possible optimization of the procedure for assisting with the MPP search in the tracking mode involves varying the time and/or level of the power change in the same direction. For example, the step width of the MPP algorithm can be influenced in known MPP search methods using the level of a power change, with the result that an approach of the generator voltage to a predicted operating voltage of maximum power can be accelerated. On the other hand, by observing the operating voltage profile of the photovoltaic generator, the converter can detect times at which the power is determined by the inverter and can adapt times at which the power change in the same direction is provided thereto. Optionally, the converter can also temporarily provide the power change in the same direction only for these times at which the power is determined. It is likewise conceivable for a global MPP search to be deliberately initiated by the inverter by suitably selecting the power change in the same direction. Such a global MPP search can also result in acceleration of the process of reaching the operating voltage of maximum power.

Nevertheless, it goes without saying that there should be a change from the tracking mode to the compensation mode of the converter again only when the operating voltage at the input has reached the predicted operating voltage of maximum power, at least except for a predefined maximum deviation. It is possible to check this criterion in the method according to the disclosure if the operating voltage of maximum power has been determined from the temporal profile of the power output by the photovoltaic generator during a preceding period in the compensation mode. It goes without saying that the situation is not excluded in which the value of the operating voltage of maximum power, as predicted by the converter, is also continuously corrected in the tracking mode with the aid of the power data from the photovoltaic generator.

In the method according to the disclosure, a change from the compensation mode to the tracking mode can be deliberately blocked if the temporal profile of the power output by the photovoltaic generator indicates that no operating voltage of maximum power can currently be found by the inverter. There are particular shadowing constellations in which conventional MPP tracking does not result in the operating voltage of maximum power being found because, for example, it is too far away from the instantaneous operating voltage at the input, the instantaneous power is subject to an excessively fast temporal change or a power maximum is not sufficiently clear. In these cases which can be detected at the converter from the temporal profile of the power output by the photovoltaic generator, the converter can either block the change to the tracking mode until these boundary conditions do not apply or assists with the finding of an operating voltage of maximum power which cannot be found by the MPP tracker of the inverter alone by means of targeted changes to the power output by it on the basis of changes in the operating voltage at the input. However, in one embodiment the latter is possible only when the actual operating voltage of maximum power can be reliably inferred from the temporal profile of the power output by the photovoltaic generator at least at the converter.

In the method according to the disclosure, the temporal profile of the power output by the photovoltaic generator can be filtered and the fluctuations in the power from the photovoltaic generator can be determined therefrom, which fluctuations are compensated for by the converter in comparison with the target power in the compensation mode. Filtering makes it possible, for example, to hide high frequency components of the fluctuations in the power from the photovoltaic generator which are either irrelevant or are compensated for by the inverter anyway. This makes it possible to avoid unnecessary fluctuations in the compensating power from the converter which burden the converter and the energy store connected via the latter.

A reversal of the energy flow direction through the converter is often particularly burdensome for the converter and the energy store connected to the latter. It may therefore be advantageous in one embodiment that fluctuations in the power from the photovoltaic generator, the compensation for which would result in a repeated reversal of the energy flow direction through the converter, are not compensated for in the compensation mode. This may apply at least to those power fluctuations of the photovoltaic generator which remain below an energy and/or power difference limit value. In this case, power fluctuations which remain below an energy difference limit value can be understood as meaning the fact that these power fluctuations are at least themselves partially averaged. Alternatively, the energy difference limit value ensures that power fluctuations of the photovoltaic generator must initially be present over a minimum period before a reversal of the energy flow direction is initiated.

It is known, in principle, that different storage media for electrical energy react with different sensitivity to fluctuations in the electrical power output by them or fed into them. However, in this case, the storage media which are less sensitive to such power fluctuations are often associated with other disadvantages, for example increased costs based on their storage capacity. Therefore, it is often desirable if electrical energy is stored in different partial stores of the energy store and is removed therefrom again using the converter, the partial stores being organized hierarchically and being used according to their suitability for fluctuating powers and/or a reversal of the energy flow direction. For this purpose, the converter can also be subdivided into partial converters each assigned only to one of the partial stores connected in parallel. That is to say, each of the partial stores is connected, in parallel with the photovoltaic generator, to the input of the inverter via a partial converter of the converter.

The target power, which is intended to flow into the inverter via the input and for the compliance with which the energy store is used via the converter at least in the compensation mode of the converter, can be predefined by an energy management system. This energy management system can be designed to maximize private consumption of the power provided by the photovoltaic system. This makes it possible to minimize the load on an AC network to which the photovoltaic system is still connected. Another aim of the energy management system may be to stabilize the AC network with the power fed in there or to achieve a maximum price for the electrical power fed into the AC network.

In one embodiment of the method according to the disclosure, the converter is operated in the compensation mode in such a manner that it compensates for fluctuations in the sum of the power from the photovoltaic generator and from a second photovoltaic generator connected to a second input of the inverter with respect to a target power flowing into the inverter via the input and the second input. For this purpose, the operating voltage at the second input and the current flowing from the second photovoltaic generator into the inverter via the second input then also needs to be recorded. In contrast, a plurality of photovoltaic generators connected to the same input of the inverter can be taken into account in the new method in the same way as a single photovoltaic generator.

A bidirectional converter according to the disclosure for connecting an energy store for electrical energy, in parallel with a photovoltaic generator, to the input of an inverter, the inverter predefining an operating voltage of the photovoltaic generator at the input and being configured to track an operating voltage of maximum power from the photovoltaic generator, has a controller which is connected to measuring devices for the voltage at the input and the current from the photovoltaic generator and carries out the method according to the disclosure. The controller is, in one embodiment, connected to at least one communication interface for communicating with an energy management system and/or the inverter and/or the photovoltaic generator. The controller can receive the target power from the energy management system. The controller can receive, inter alia, the operating voltage at the input from the converter. The controller can receive the current flowing from the photovoltaic generator from the latter. The converter according to the disclosure therefore does not necessarily need its own measuring devices.

Advantageous developments of the disclosure emerge from the patent claims, the description and the drawings. The advantages of features and of combinations of a plurality of features mentioned in the description are only examples and can take effect alternatively or cumulatively without necessarily having to achieve the advantages of embodiments according to the disclosure. Without this changing the subject matter of the accompanying patent claims, the following applies to the disclosure content of the original application documents and the patent: further features can be gathered from the drawings, in particular the geometries illustrated and the relative dimensions of a plurality of components with respect to one another and their relative arrangement and operative connection. In a manner deviating from the selected dependency references of the patent claims, it is likewise possible and is hereby suggested to combine features of different embodiments of the disclosure or features of different patent claims. This also relates to those features which are illustrated in separate drawings or are mentioned during the description thereof. These features can also be combined with features of different patent claims. Features cited in the patent claims may likewise be dispensed with for further embodiments of the disclosure.

The features mentioned in the patent claims and in the description should be understood, in terms of their number, such that precisely this number or a number greater than the number mentioned is present, without this requiring explicit use of the phrase "at least". If the text therefore refers to one element, for example, this can be understood as meaning that precisely one element, two elements or more elements is/are present. These features can be supplemented with other features or may be the only features of which the respective product consists.

The reference symbols contained in the patent claims do not restrict the scope of the subject matters protected by the patent claims. They serve only the purpose of making the patent claims easier to understand.

BRIEF DESCRIPTION OF THE DRAWINGS

The disclosure is described and explained in more detail below using exemplary embodiments with reference to the accompanying figures.

DETAILED DESCRIPTION

The disclosure relates to a method for operating a photovoltaic system comprising an energy store, which has the features of the preamble of independent patent claim 1. The disclosure also relates to a bidirectional converter for connecting an energy store, which implements such a method.

The energy store may be, in particular, a rechargeable battery or a battery, for example also a capacitor battery. However, the energy store may in principle also comprise an electrical machine and a flywheel mass in order to buffer electrical energy in the form of mechanical energy. The energy store may also be composed of different partial energy stores.

Figure 1:
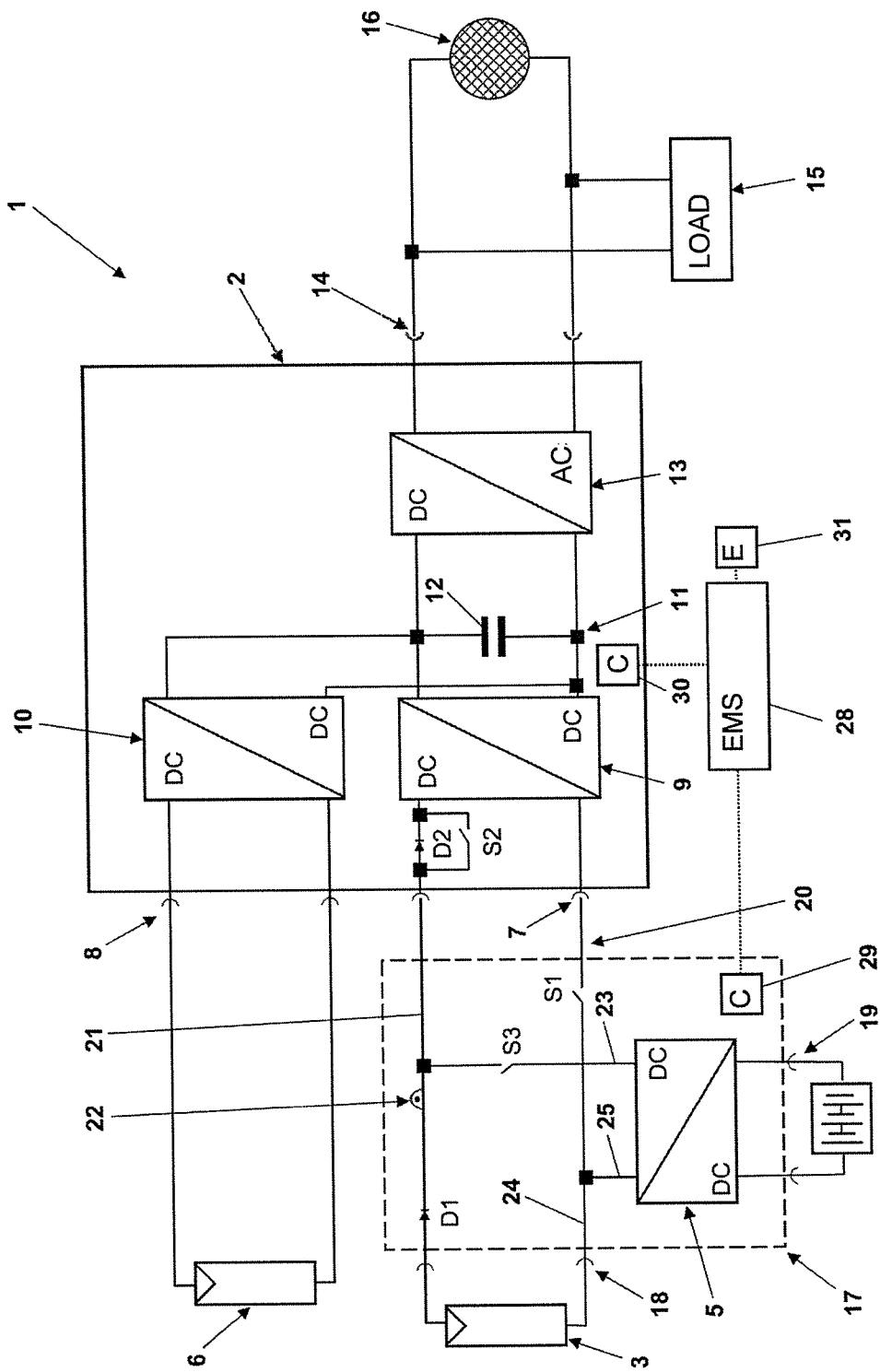
FIG. 1 shows a photovoltaic system which is operated in accordance with the method according to the disclosure.

As substantial parts of the present disclosure, the photovoltaic system 1 shown in FIG. 1 has an inverter 2, a first photovoltaic generator 3, an energy store 4 and a bidirectional converter 5. In addition to the first photovoltaic generator 3, a second photovoltaic generator 6 is also provided. The photovoltaic generators 3 and 6 are connected to separate inputs 7 and 8 of the inverter 2. For each of the inputs 7 and 8, the inverter 2 has a DC/DC converter 9 and 10, via which the respective input 7 and 8 is connected to a common DC voltage intermediate circuit 11 having an intermediate circuit capacitor 12. A DC/AC converter 13 of the inverter 2 is fed from the DC voltage intermediate circuit 11 and outputs an alternating current at an output 14 of the inverter 2. If not consumed by a load 15 locally assigned to the photovoltaic system 1, this alternating current is fed into an AC network 16.

The separate DC/DC converters 9 and 10 for the inputs 7 and 8 are used to predefine operating voltages for the photovoltaic generators 3 and 6 at the inputs 7 and 8, at which voltages a maximum power is obtained from the photovoltaic generators 3 and 6. These operating voltages of maximum power may differ from one another in the photovoltaic generators 3 and 6 and also change throughout the day and with varying shadowing conditions, in particular as a result of clouds, in each of the photovoltaic generators 3 and 6. The tracking of the operating voltage of maximum power is also referred to as MPP (Maximum Power Point) tracking and the DC/DC converters 9 and 10 are accordingly referred to as MPP trackers. In a photovoltaic system 1 according to the disclosure, the second input 8 with the associated second DC/DC converter 10 for the second photovoltaic generator 6 is only one option.

The energy store 4 is connected, in parallel with the first photovoltaic generator 3, to the input 7 of the inverter 2 via the converter 5. In this case, the energy store 4 is indicated as a battery; the bidirectional converter 5 is accordingly a DC/DC converter in one embodiment. According to FIG. 1, the converter 5 is part of a converter unit 17 having a generator input 18, a store input 19 and an output 20. The first photovoltaic generator 3 is connected to the generator input 18. The energy store 4 is connected to the store input 19; and the output 20 is connected to the input 7 of the inverter 2. A diode D1 and a current sensor 22 are provided in a line 21 which connects one pole of the generator input 18 to one pole of the output 20, and a line 23 containing a switch S3 branches off to the converter 5. A switch S1 is provided in a line 24 which connects the other pole of the generator input 18 to the output 20, and a further line 25 branches off to the converter 5. A diode D2 which is connected in parallel with an optional switch S2 is provided in the continuation of the line 21 between the input 7 and the DC/DC converter 9. The diode D1 can be replaced with an active switch (not illustrated).

The diodes D1 and D2 are used to protect against fault currents in the first photovoltaic generator 3 or from the inverter 2. The switches S1 to S3 can be used to connect the energy store 4 and the inverter 2 to one another in pairs. In this case, the switch S2 also makes it possible to feed electrical power from the second photovoltaic generator 6 into the energy store 4 via the intermediate circuit 11. Specifically, the switch S3 can be closed and the switch S1 can be opened in order to solely charge the energy store 4 with the aid of the first photovoltaic generator 3. In order to solely discharge the energy store 4 into the inverter 2, both switches S3 and S1 are closed, and the converter 5 injects a higher voltage than the first photovoltaic generator 3 in order to reverse bias the diode D1. Alternatively, the switch optionally provided instead of the diode D1 can be opened. In order to charge the energy store 4 from the second photovoltaic generator 6, the switch S2 must also be closed in addition to the switches S1 and S3 and, if the intention is not to charge from the first photovoltaic generator 3 as well, the switch optionally provided instead of the diode D1 should be opened.

In another embodiment (not shown) of the disclosure, a further converter unit, the structure and function of which correspond to the converter unit 17, is connected to the input 8 in parallel with the second photovoltaic generator 6, with the result that each converter unit is assigned to one of the photovoltaic generators 3, 6. In this case, it is not only possible for both converter units to have their own energy stores but also for them to share a common energy store 4.

In yet another embodiment (not shown) of the disclosure, only current and voltage of the second photovoltaic generator 6 are transmitted to the converter unit 17 individually or as a combined power value. For this purpose, additional measuring devices may be provided or measuring devices of the inverter 2 which are present anyway may be used for the voltage at the input 8 and the current from the second photovoltaic generator 6. In order to determine the power fluctuation to be compensated for in the manner described below, not only is the power from the first photovoltaic generator 3 then taken into account, but rather the sum of the power from the two photovoltaic generators 3 and 6 is taken as a basis.

The operating modes of the photovoltaic system 1 described to this point do not make it possible, however, to compensate for power fluctuations of the photovoltaic generator 3 during ongoing operation of the photovoltaic system 1 with the aid of the energy store 4. In order to achieve this compensation without colliding with the MPP tracking of the inverter 2 for the photovoltaic generator 3 by means of the DC/DC converter 9, a method shown in FIG. 2 in the form of a flowchart is provided. The method has a loop which is illustrated on the left in FIG. 2 and corresponds to a compensation mode 26 of the converter 5, and a loop which is illustrated on the right in FIG. 2 and corresponds to a tracking mode 27 of the converter 5. The current recorded using the current sensor 22 according to FIG. 1, the operating voltage $U_{PV}$ at the input 7, a power $P_{PV}$ determined from the current and the operating voltage by means of multiplication and its profile over time, which are determined in the converter unit 17, serve as the basis for the method illustrated in FIG. 2. In addition, a target power $P_{Soll}$ is predefined for the converter unit. FIG. 1 indicates that this is carried out using an energy management system (EMS) 28 which communicates with a controller (C) 29 of the converter 5, a controller (C) 30 of the inverter 2 and external locations (E) 31. These external locations 31 may document, for example, the consumption by the load 15, with the result that the energy management system (EMS) 28 can optimize private consumption of the electrical power generated by the photovoltaic system 1 by the load 15.

Figure 2:
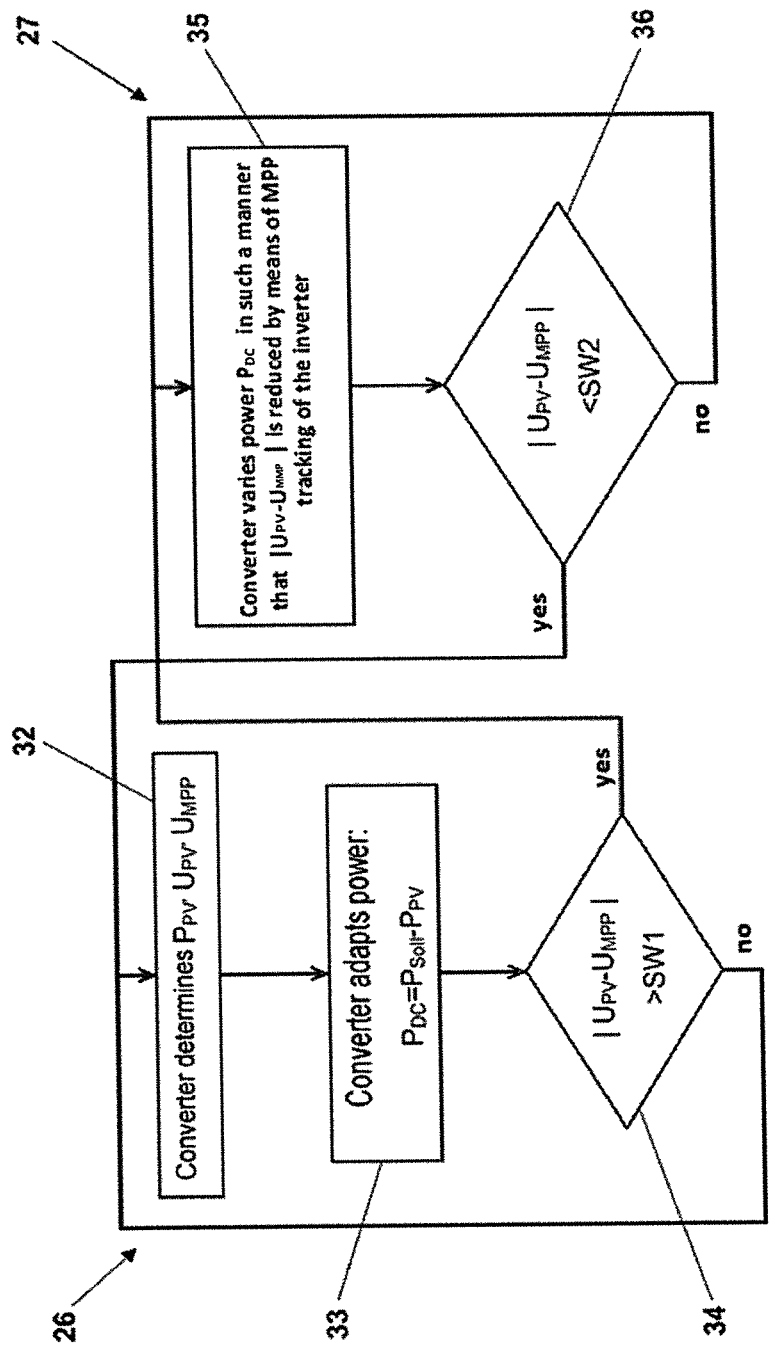
FIG. 2 is a flowchart of one embodiment of a method according to the disclosure.

At 32 according to FIG. 2, the instantaneous power $P_{PV}$ from the photovoltaic generator 3, the operating voltage $U_{PV}$ and, from the temporal profile of the power, also the currently predicted (not applied) operating voltage $U_{MPP}$ of maximum power from the photovoltaic generator 3 are determined at the converter 5, that is to say in the converter unit 17, according to FIG. 1. In a subsequent act 33, the power $P_{DC}$ output by the converter 5 to the input 7 (or branched off there) is adapted in the compensation mode in such a manner that a difference between the target power $P_{Soll}$ and the power $P_{PV}$ from the photovoltaic generator 3 is compensated for, with the result that the sum of the converter power $P_{DC}$ and the generator power $P_{PV}$ corresponds to the target power $P_{Soll}$. A subsequent act 34 checks whether the instantaneous operating voltage $U_{PV}$ differs from the operating voltage $U_{MPP}$ by more than a first threshold SW1. If this is the case, a change is made to the tracking mode 27, otherwise the loop of the compensation mode 26 begins again at 32. In the tracking mode 27, the converter keeps its power $P_{DC}$ constant or varies it in such a manner that the difference between the instantaneous operating voltage $U_{PV}$ and the predicted operating voltage $U_{MPP}$ of maximum power is reduced by the MPP tracking of the inverter. For this purpose, the converter 5 can vary its power $P_{DC}$ in the same direction as the changes in the power $P_{PV}$ from the photovoltaic generator 3, in particular, with changes in the operating voltage $U_{PV}$ in order to accelerate the MPP tracking. A subsequent act 36 checks the extent to which the instantaneous voltage $U_{PV}$ has already approached the predicted operating voltage $U_{MPP}$ of maximum power determined in the compensation mode 26. If this is effected to below a second threshold SW2, a change is made from the tracking mode 27 back to the compensation mode 26. Alternatively, the tracking mode 27 can also be retained as long as a deviation of the power fed in at the input 7 of the inverter 2, that is to say the sum of the powers $P_{DC}$ and $P_{PV}$, from the target power $P_{Soll}$ does not exceed a threshold set for this, as long as no change in the power $P_{DC}$ from the converter 5 according to FIG. 1 is also indicated.

The invention claimed is:

1. A method for operating a photovoltaic system including an inverter, a photovoltaic generator connected to an input of the inverter, an energy store, and a bidirectional converter connecting the energy store to the input, in parallel with the photovoltaic generator, wherein the inverter predefines an operating voltage ($U_{PV}$) of the photovoltaic generator at the input and is configured to track an operating voltage ($U_{MPP}$) of maximum power output ($P_{PV}$) from the photovoltaic generator, the method comprising:
  recording a temporal profile of the power ($P_{PV}$) output by the photovoltaic generator using the bidirectional converter,
  operating the bidirectional converter in a tracking mode to enable inverter tracking of the operating voltage ($U_{MPP}$) of maximum power,
  operating the bidirectional converter in a compensation mode to compensate for fluctuations in the power ($P_{PV}$) output from the photovoltaic generator in comparison with a target power ($P_{soll}$) flowing into the inverter via the input by adapting a power ($P_{DC}$) output by the bidirectional converter at the input or branched therefrom, to equalize a sum of the power ($P_{DC}$) from the bidirectional converter and the power ($P_{PV}$) output from the photovoltaic generator to the target power ($P_{soll}$), and repeatedly switching the bidirectional converter between the compensation mode and the tracking mode while the power ($P_{PV}$) output from the photovoltaic generator is available.

2. The method as claimed in claim 1, wherein repeatedly switching comprises changing from the compensation mode to the tracking mode at least once per hour during ongoing operation of the photovoltaic system and changing back to the compensation mode within two minutes of entering the tracking mode.

3. The method as claimed in claim 1, wherein repeatedly switching comprises changing between the compensation mode and the tracking mode after predefined periods.

4. The method as claimed in claim 1, further comprising inferring the operating voltage ($U_{MPP}$) of maximum power from the temporal profile of the power ($P_{PV}$) output by the photovoltaic generator in the compensation mode, and changing from the compensation mode to the tracking mode of the bidirectional converter if the operating voltage ($U_{PV}$) at the inverter input deviates from the inferred operating voltage ($U_{MPP}$) of maximum power beyond a predefined extent.

5. The method as claimed in claim 4, wherein operating the bidirectional converter in the tracking mode comprises tracking of the operating voltage ($U_{MPP}$) of maximum power by the inverter including additional power changes based on changes in the operating voltage ($U_{PV}$) at the inverter input, the additional power changes being in the same direction in the bidirectional coupler as the corresponding power changes of the photovoltaic generator.

6. The method as claimed in claim 4, wherein repeatedly switching comprises changing from the tracking mode to the compensation mode of the bidirectional converter if the operating voltage ($U_{PV}$) at the inverter input has reached the operating voltage ($U_{MPP}$) of maximum power up to a predefined maximum deviation.

7. The method as claimed in claim 1, further comprising blocking a switch from the compensation mode to the tracking mode if the temporal profile of the power ($P_{PV}$) output by the photovoltaic generator indicates that no operating voltage ($U_{MPP}$) of maximum power can currently be found by the inverter.

8. The method as claimed in claim 1, further comprising filtering the temporal profile of the power ($P_{PV}$) output by the photovoltaic generator and determining the fluctuations in the power ($P_{PV}$) from the photovoltaic generator from the filtered temporal power profile, wherein the fluctuations are compensated for by the bidirectional converter in comparison with the target power ($P_{soll}$) in the compensation mode.

9. The method as claimed in claim 1, wherein fluctuations in the power ($P_{PV}$) from the photovoltaic generator resulting in a reversal of the energy flow direction through the bidirectional converter, if compensated for, and remaining below an energy and/or power difference limit value, are not compensated for in the compensation mode.

10. The method as claimed in claim 1, further comprising storing electrical energy in different partial stores of the energy store and removing the electrical energy therefrom again using the bidirectional converter, wherein the partial stores are organized hierarchically and are used according to their suitability for fluctuating power ($P_{DC}$) and/or a reversal of the energy flow direction.

11. The method as claimed in claim 1, further comprising predefining the target power ($P_{soll}$) using an energy management system used to track maximization of private consumption of the power provided by the photovoltaic system.

12. The method as claimed in claim 1, wherein the bidirectional converter is operated in the compensation mode such that the bidirectional converter compensates for fluctuations in the sum of the power ($P_{PV}$) from the photovoltaic generator and from a second photovoltaic generator connected to a second input of the inverter with respect to a target power ($P_{soll}$) flowing into the inverter via the input and the second input.

13. A bidirectional converter for connecting an energy store for electrical energy, in parallel with a photovoltaic generator, to an input of an inverter, the inverter predefining an operating voltage ($U_{PV}$) of the photovoltaic generator at the inverter input and being configured to track an operating voltage ($U_{MPP}$) of maximum power from the photovoltaic generator, the bidirectional converter comprising:

a controller; and measuring devices connected to the controller and adapted to measure current and voltage of the photovoltaic generator, wherein the controller is configured to:

record a temporal profile of the power ($P_{PV}$) output by the photovoltaic generator using the bidirectional converter, operate the bidirectional converter in a tracking mode to enable tracking the operating voltage ($U_{MPP}$) of maximum power using the inverter, operate the bidirectional converter in a compensation mode such that the bidirectional converter compensates for fluctuations in the power ($P_{PV}$) from the photovoltaic generator in comparison with a target power ($P_{soll}$) flowing into the inverter via the input by adapting the power ($P_{DC}$) output by the bidirectional converter at the input or branched off from there such that a sum of the power ($P_{DC}$) from the bidirectional converter and the power ($P_{PV}$) from the photovoltaic generator is equal to the target power ($P_{soll}$), and repeatedly change between the compensation mode and the tracking mode during ongoing operation of the photovoltaic system in which power ($Pp_v$) from the photovoltaic generator is available.

14. The bidirectional converter as claimed in claim 13, further comprising second measuring devices connected to the controller and adapted to measure current and voltage of a second photovoltaic generator connected to a second input of the inverter.

15. The bidirectional converter as claimed in claim 13, wherein the controller is connected to at least one communication interface for communicating with an energy management system and/or the inverter and/or the photovoltaic generator.

* * * * *